US007538603B2

(12) United States Patent
Ikeda et al.

(10) Patent No.: US 7,538,603 B2
(45) Date of Patent: May 26, 2009

(54) SIGNAL DISTRIBUTION ARCHITECTURE AND SEMICONDUCTOR DEVICE

(75) Inventors: Hiroaki Ikeda, Tokyo (JP); Mamoru Sasaki, Hiroshima (JP); Atsushi Iwata, Hiroshima (JP); Mitsuru Shiozaki, Hiroshima (JP); Atsushi Mori, Hiroshima (JP)

(73) Assignee: Elpida Memory, Inc., Tokyo (JP)

( * ) Notice: Subject to any disclaimer, the term of this patent is extended or adjusted under 35 U.S.C. 154(b) by 40 days.

(21) Appl. No.: 11/744,694

(22) Filed: May 4, 2007

(65) Prior Publication Data

US 2007/0285179 A1 Dec. 13, 2007

(30) Foreign Application Priority Data

May 8, 2006 (JP) ............................. 2006-129190
Feb. 5, 2007 (JP) ............................. 2007-025872

(51) Int. Cl.
*H01L 25/00* (2006.01)
(52) U.S. Cl. ...................................... 327/565
(58) Field of Classification Search ................ 327/564, 327/565
See application file for complete search history.

(56) References Cited

U.S. PATENT DOCUMENTS 5,656,963 A * 8/1997 Masleid et al. ............... 327/297
7,015,765 B2 * 3/2006 Shepard et al. ......... 331/117 D
2005/0114820 A1 5/2005 Restle

FOREIGN PATENT DOCUMENTS

JP 2005-159353 A 6/2005

OTHER PUBLICATIONS

Shiozaki, et al., "20 GHz uniform-phase uniform-amplitude standing-wave clock distribution", IEICE Electronics Express, Nov. 2005, pp. 11-16, vol. 3, No. 2, IEICE.
Sasaki, et al., "17GHz Fine Grid Clock Distribution with Uniform-Amplitude Standing-Wave Oscillator", 2006 Symposium on VLSI Circuits Digest of Technical Papers, 2006, pp. 124-125, IEEE.
Sasaki, et al., "12GHz Low-Area-Overhead Standing-Wave Clock Distribution with Inductively-Loaded and Coupled Technique", 2007 IEEE Interntional Solid-State Circuits Conference, 2007, pp. 180-181, IEEE.
Hofstee, et al., "A 1GHz Single-Issue 64b PowerPC Processor", IEEE International Solid-State Circuits Conference Digest of Technical Papers, 2000, IEEE.
McPherson, et al., "760MHz G6 S/390 Microprocessor Exploiting Multiple Vt and Copper Interconnects", IEEE International Solid-State Circuits Conference Digest of Technical Papers, 2000, IEEE.

(Continued)

*Primary Examiner*—Jeffrey S Zweizig
(74) *Attorney, Agent, or Firm*—Sughrue Mion, PLLC

(57) ABSTRACT

Provided is a grid-type high-speed clock signal distribution network capable of reducing a difference in amplitude of a standing wave on a transmission line and of supplying a signal from any position. The network for transmitting the clock signal is such that ends of the differential signal transmission line are connected via an inductor, a low-amplitude segment is eliminated by a phase shift in the inductor and a standing wave of substantially uniform phase and amplitude is produced, wherein the number of lines connected to the grid point is made the same for entire grid points.

20 Claims, 14 Drawing Sheets

OTHER PUBLICATIONS

Chan, et al., "Uniform-Phase Uniform-Amplitude Resonant-Load Global Clock Distributions", IEEE Journal of Solid-State Circuits, Jan. 2005, pp. 102-109, vol. 40, No. 1, IEEE.

O'Mahony, et al., "10GHz Clock Distribution Using Coupled Standing-Wave Oscillators", IEEE International Solid-State Circuits Conference Digest of Technical Papers, 2003, IEEE.

Bindal, et al., "Scalable Sub-10ps Skew Global Clock Distribution for a 90nm Multi-GHz IA Microprocessor", IEEE International Solid-State Circuits Conference Digest of Technical Papers, Feb. 2003, IEEE.

* cited by examiner

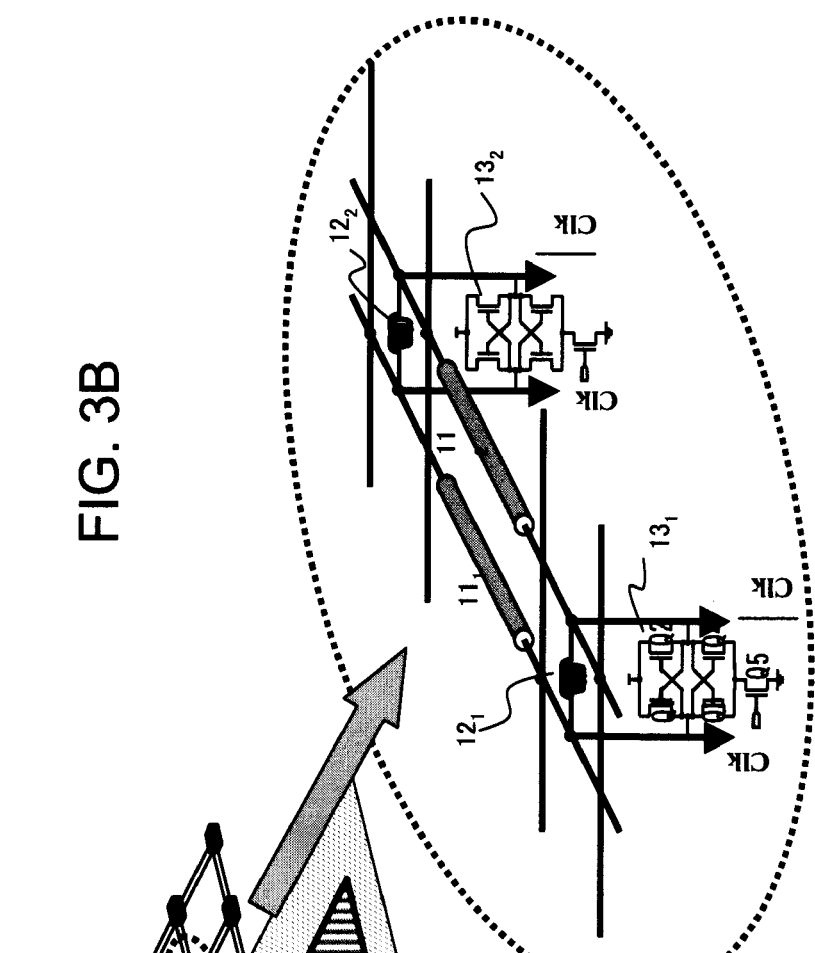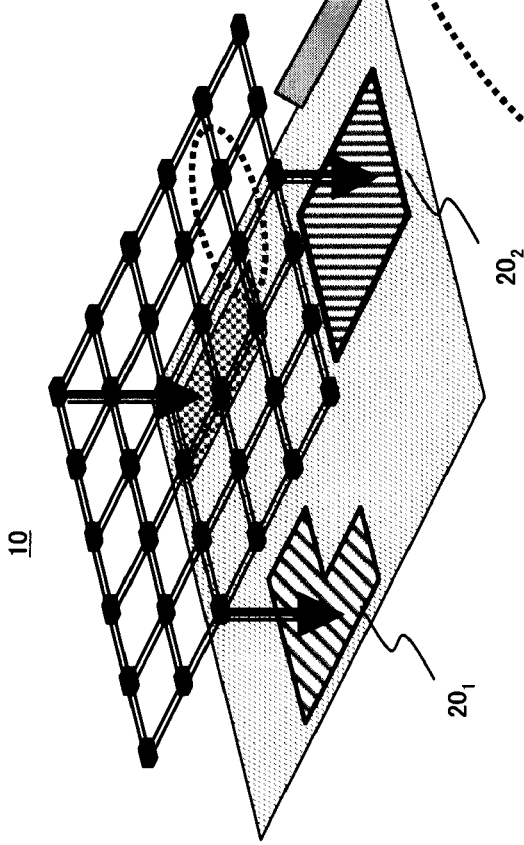
FIG. 3A
FIG. 3B

101: CLOCK DRIVER

GRID TYPE (NO STANDING WAVE)

102: LOAD CIRCUIT

TREE TYPE clock sectors

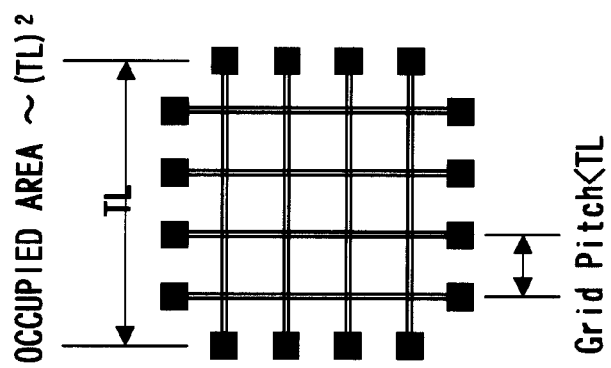
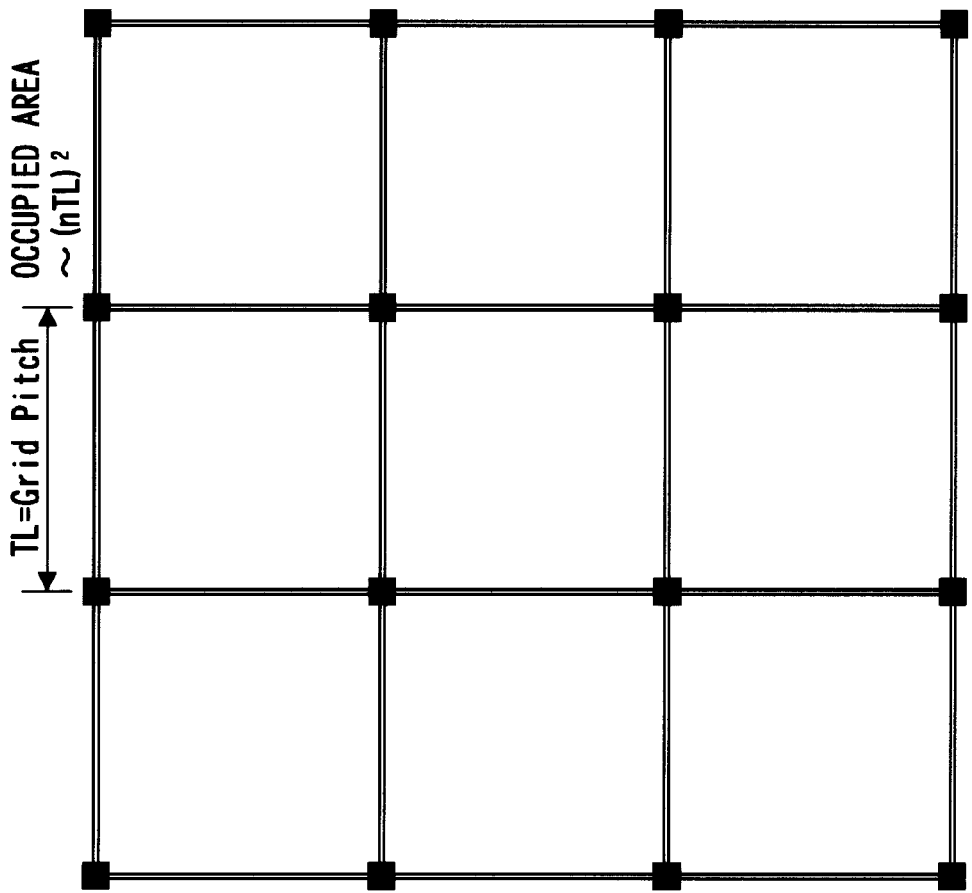

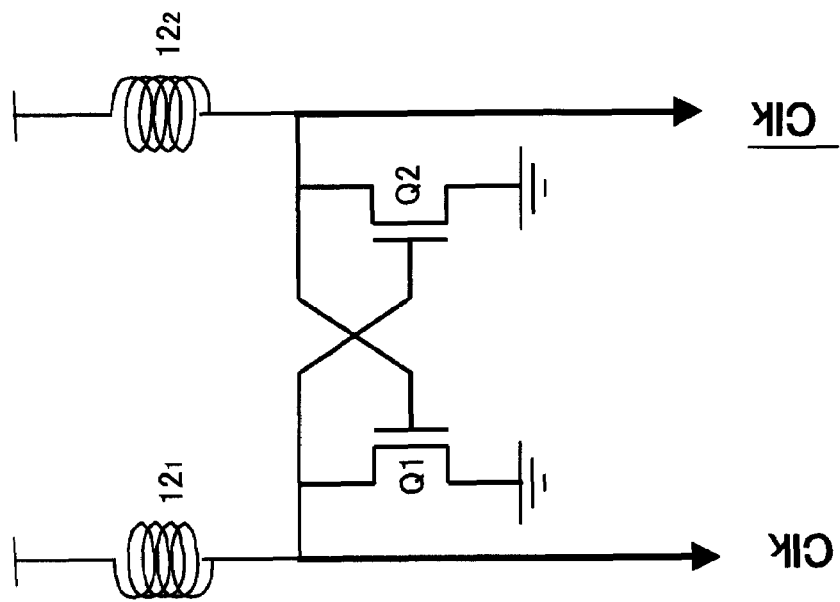
FIG. 13B
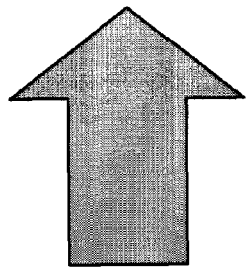
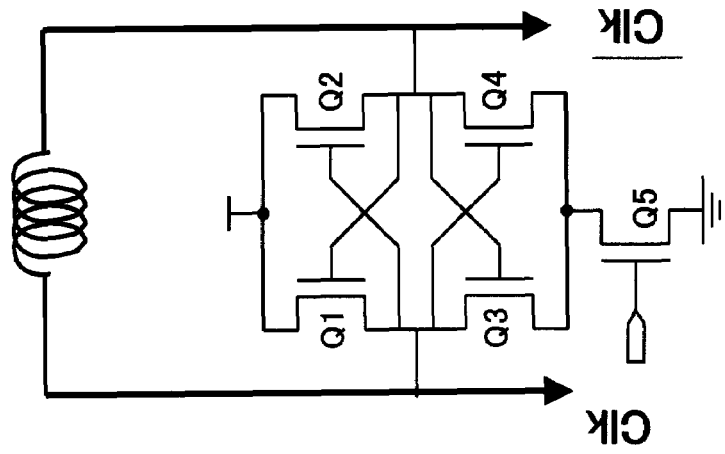
FIG. 13A

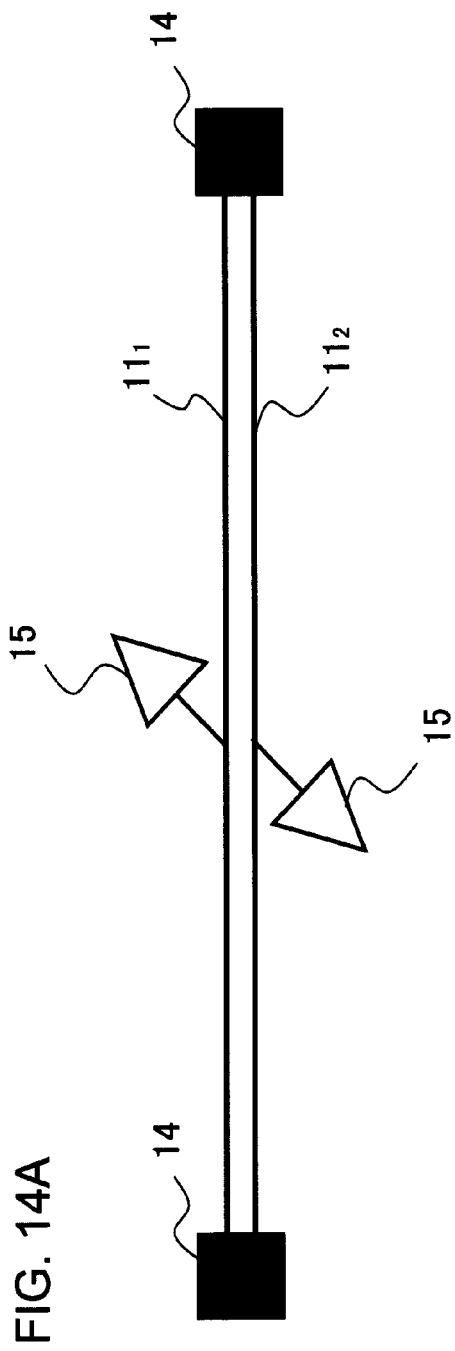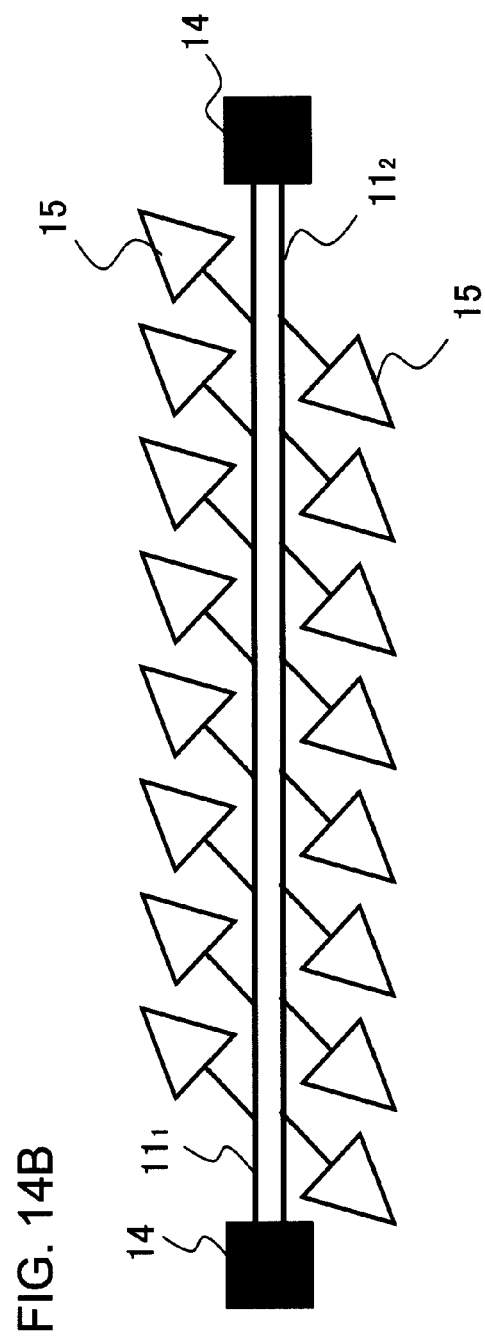

SIGNAL DISTRIBUTION ARCHITECTURE AND SEMICONDUCTOR DEVICE

FIELD OF THE INVENTION

This invention relates to the structure of a signal transmission line and, more particularly, to a signal distribution architecture ideal for application to transmission of high-speed signals and to a semiconductor device having this signal distribution architecture.

BACKGROUND OF THE INVENTION

Clock frequencies used in large-scale integrated circuits (LSI circuits) have reached the gigahertz band in recent years. In an LSI circuit, clock signal is distributed to all clock synchronous elements via a clock distribution network (wirings and buffer circuits, etc.). Tree-type and grid-type clock distribution arrangements have long been used as typical means for clock distribution adapted to reduce a phase difference at the clock terminals of the clock-synchronous elements within an LSI circuit.

With the tree (H-tree) arrangement, the clock branches in the form of a tree and is supplied to the clock synchronous elements (load circuits) from a centrally located clock driver, and repeaters (buffers) are placed at the signal branch points (see FIG. 6A). In the H-tree distribution system, the distances from the clock driver to load circuits at the ends of the branches are equal if the system is well-balanced.

On the other hand, an interconnection structure in which the clock supply lines extend in the directions of rows and columns and load circuits are placed at grid points is in use as a grid-type arrangement (see FIG. 6B).

Also known is an arrangement such as a tree-driven grid that is a mixture of the tree- and grid-type arrangements. With regard to a configuration in which both the H-tree and grid arrangements are combined as a global clock distribution system in which a clock is distributed to all synchronized elements in an LSI circuit, see the descriptions given in Non-Patent Documents 1 and 2, etc.

In cases where the tree system is used for global clock distribution, a buffer (repeater) is placed at each terminal point of the tree and at each branch point where the wiring branches in two directions. In order to distribute a gigahertz-band clock within an LSI chip while suppressing clock skew throughout the interior of the chip, it is required that the delay times of the repeaters in the terminal stages be adjusted in ps units, by way of example. Consequently, in a case where an ultra-high-speed clock is distributed in large scale and multiple layers in an LSI chip, the delay times of the repeaters in the terminal stages constitute an obstacle and implementation is difficult. In addition, in order to equalize load with the tree arrangement, a balanced branching configuration is required. However, achieving perfect balance is difficult.

Further, with the tree-type clock distribution, jitter can be kept small in a case where the hierarchical level (number of stages) of a branch is shallow. When the level of a layer increases, however, so does jitter. In the case of the tree-type global clock distribution, the scale of signal distribution depends upon the characteristics and performance (e.g., jigger, delay, variation and power dissipation) of the repeaters, as mentioned above. Application of this technique to LSI circuits that will be of even larger scale and higher speed in the future will be difficult.

Thus, large-scale clock distribution in a microprocessor operated at a clock frequency of gigahertz band has become increasingly difficult. Skew and jitter are proportional to latency. With the conventional tree architecture, however, a reduction in latency does not go hand in hand with a shortening of clock period.

With tree- or grid-type clock distribution, the clock is propagated using traveling waves (not standing waves) and the range of clock-skew adjustment is 10 ps at most.

Holding the amount of skew or jitter to less than 5% of the clock period is accepted as one criteria, and 5 GHz is assumed to be the upper limit in the case of the H-tree.

In order to produce and distribute a clock having a frequency greater than the 10 GHz that is necessary for ultra-high-speed logic, a clock distribution system that relies upon standing waves, which do not include traveling waves, instead of non-standing waves, has been proposed (e.g., see Non-Patent Document 3 or Non-Patent Document 4).

In the case of the topology proposed in Non-Patent Document 3, a tank circuit is formed at each tree branch point and inductors placed in the branches are adjusted individually to mitigate skew, as illustrated in FIGS. 7A and 7B. Patent Document 1 also discloses an arrangement of the kind illustrated in FIGS. 7A and 7B. In the case of FIGS. 7A and 7B, however, the adjusting locations are of a scale equivalent to that for adjusting delay time in a system that uses repeaters, such as the tree-type system. Accordingly, this arrangement is not suited to clock distribution in very large LSI circuits.

Further, Non-Patent Document 4 discloses an arrangement in which the frequency of standing waves in signal wiring is made to coincide with clock frequency to reduce clock skew of the entire chip at physical placement positions and make possible distribution of an ultra-high-frequency clock of 10 GHz, etc., using a 0.18 μm standard CMOS process, as illustrated in FIGS. 8A and 8B. A standing-wave oscillator (SWO) eliminates wire losses using distributed gain and maintains low-skew standing waves. NMOS cross-coupled pairs provide enough gain to compensate for wire losses. The ends of differential transmission line are short-circuited to produce a half-wave length resonator.

In the arrangement of FIGS. 8A and 8B, however, the amplitude of the standing waves varies with location. Further, the length of transmission lines is fixed at λ/2 and the system does not adapt itself well to physical changes such as scaling.

[Patent Document 1]
    Japanese Patent Kokai Publication No. JP-P2005-159353A

[Non-Patent Document 1]
    P. Hofstee, N. Aoki, D. Boerstler, P. Coulman, S. Dhong, B. Flachs, N. Kojima, O. Kwon, K. Lee, D. Meltzer, K. Nowka, J. Park, J. Peter, S. Posluszny, M. Shapiro, J. Silberman, O. Takahashi, B. Weinberger, "A 1 GHz Single-Issue 64b PowerPC Processor," IEEE International Solid-State Circuits Conference Digest of Technical Papers, 2000

[Non-Patent Document 2]
    T. McPherson, R. Averill, D. Balazich, K. Barkley, S. Carey, Y. Chan, Y. H. Chan, R. Crea, A. Dansky, R. Dwyer, A. Haen, D. Hoffman, A. Jatkowski, M. Mayo, D. Merrill, T. McNamara, G. Northrop, J. Rawlins, L. Sigal, T. Slegel, D. Webber, P. Willimans, F. Yee, "760 MHz G6 S/390 Microprocessor Exploiting Multiple Vt and Copper Interconnects," IEEE International Solid-State Circuits Conference Digest of Technical Papers, 2000

[Non-Patent Document 3]
    Steven C. Chan, Kenneth L. Shepard and Phillip J. Restle, "Uniform-Phase Uniform-Amplitude Resonant-Load Global Clock Distributions," IEEE Journal of Solid-State Circuits, Vol. 40, No. 1, January 2005

[Non-Patent Document 4]

Frank O'Mahony, C. Patrick Yue, Mark Horowitz, S. Simon Wong, 24-4, "10 GHz Clock Distribution Using Coupled Standing-Wave Oscillators," IEEE International Solid-State Circuits Conference Digest of Technical Papers, pp. 428-429, 2003

[Non-Patent Document 5]

Niraj Bindal, Timothy Kelly, Nicholas Velastegui, Keng L. Wong, "Scalable Sub-10 ps Skew Global Clock Distribution for a 90 nm Multi-GHz IA Microprocessor," IEEE International Solid-State Circuits Conference Digest of Technical Papers, pp. 346-347 February 2003

SUMMARY OF THE DISCLOSURE

A problem with the conventional grid-type clock distribution networks using standing waves in Non-Patent Document 4, etc., is that standing-wave amplitude in the distribution network differs greatly depending upon the spatial position on a transmission line. FIG. 9A illustrates a conventional transmission line and FIG. 9B a standing wave in the transmission line. The standing wave is produced by superimposition of incident and reflected waves. As illustrated in FIG. 9B, depending upon position along the transmission line, amplitude for a viable clock signal is inadequate. Consequently, reception of a clock signal by a receiving circuit is difficult in this region of inadequate amplitude and, hence, the clock is not supplied to the synchronized elements. That is, because the standing waves on each of the transmission lines of the grid network undergo a major change in amplitude depending upon spatial position along the transmission lines, a limitation is imposed upon the locations at which driven circuits are placed.

Further, according to the conventional standing-wave system of Non-Patent Document 4, etc., transmission-line length is fixed uniquely at λ/2, which is 3.6 mm with a 20-GHz clock employed in typical CMOS technology. In a mesh structure using a standing-wave clock oscillator, it is difficult to reduce grid pitch. That is, since frequency control is uniquely decided by transmission-line length, a limitation is imposed with regard to scaling.

Further, in standing-wave signal generation, conventionally a self-inductance and an oscillating circuit are placed at the cross points of the standing-wave paths. As a consequence, standing-wave supply grid length is defined by the length of one standing-wave path and it is required that the occupied area be a whole-number multiple of path length corresponding to the number of grid points required by the circuitry.

Accordingly, an object of the present invention is to provide an entirely novel signal distribution system and semiconductor device based upon generation of standing waves and utilizing an inductive load to thereby solve the problems of the conventional art.

According to the present invention, inductive loads are provided at both ends of a transmission line and a low-amplitude segment of a standing wave is eliminated, thereby freely generating a standing wave having a constant phase and a substantially uniform amplitude over the transmission line.

In a grid-type clock distribution network for transmitting a clock signal according to the present invention, the ends of differential (complementary) transmission line is connected via an inductor and a low-amplitude segment is eliminated by a phase shift in the inductor, whereby there is produced a standing wave of substantially uniform phase and amplitude.

In the present invention, both ends of the complementary transmission lines are connected via respective inductors.

In the present invention, both ends of the complementary transmission lines are equipped with respective oscillating circuits.

In the present invention, the number of transmission lines connected to each of the grid points is made the same.

In the present invention, the clock signal transmitted through the clock distribution network takes on a frequency that does not depend upon grid pitch.

A signal interconnection architecture according to the present invention comprises differential transmission lines in the form of a grid; and phase compensating circuits provided between complementary signal transmission lines at grid points of the complementary signal transmission lines.

In the present invention, oscillating circuits are provided at the grid points of the complementary signal transmission lines.

In the present invention, the phase compensating circuit includes an inductance.

In the present invention, the phase compensating circuit includes an inductance and a variable capacitance.

In the present invention, the number of lines connected to a grid point is the same for all grid points.

In the present invention, it is possible to supply a signal from any position of a complementary signal transmission line to signal-supply destination circuit.

In the present invention, the signal interconnection architecture has a three-dimensional structure in which grid interconnection and oscillating circuits are formed in a layer separate from that of a group of signal-supply destination circuits.

In the present invention, the distances between grid points are identical.

A circuit according to another aspect of the present invention uses mutual inductance as an inductance for phase compensation, and it will suffice if placement of a standing-wave path is such that the end portion thereof contacts another standing-wave path. This enables grid pitch to be set at will and enables a large reduction in the area occupied by the standing-wave supply system corresponding to the number of grid points required by the circuitry.

The meritorious effects of the present invention are summarized as follows.

In accordance with the present invention, a difference in amplitude of a standing wave on a transmission line is reduced in a grid network, it is possible to supply a signal from any location, and it is possible to support scaling.

In accordance with the present invention, the length of transmission lines can be reduced to, e.g., more than one-tenth that employed with the conventional standing-wave techniques, thereby enabling a clock frequency on the order of multiple gigahertz. The invention is well suited for finer patterning. Furthermore, according to the present invention, low jitter, low skew and low power dissipation are achieved. That is, in accordance with the present invention, it is possible to transmit an ultra-high-speed clock signal in a form ideal in terms of chip area and power dissipation.

The present invention is ideal for application to clock distribution, etc., in a three-dimensional LSI circuit.

In accordance with another aspect of the present invention, mutual inductance is used as an inductance for phase compensation, and it will suffice if placement of a standing-wave path is such that the end portion thereof contacts another standing-wave path. This enables grid pitch to be set at will and enables a large reduction in the area occupied by the standing-wave supply system corresponding to the number of grid points required by the circuitry. The present invention contributes a reduction in occupied area and power dissipation.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3A is a diagram illustrating the configuration of a grid network according to an example of the present invention, and FIG. 3B is a diagram illustrating the configuration of a unit transmission line in the grid network;

FIG. 11A is a diagram illustrating occupied area according to the example of FIGS. 3A and 3B, and FIG. 11B is a diagram illustrating occupied area according to the example of FIGS. 10A and 10B;

FIG. 13A is a diagram illustrating the configuration of an oscillating circuit according to the examples of FIGS. 3A and 3B, and FIG. 13B is a diagram illustrating the configuration of an oscillating circuit according to the example of FIGS. 10A and 10B; and FIGS. 14A and 14B are diagrams exemplifying methods of extracting a clock from each of the standing-wave paths in the example of FIGS. 10A and 10B.

EXAMPLES OF THE INVENTION

Figure 1A:
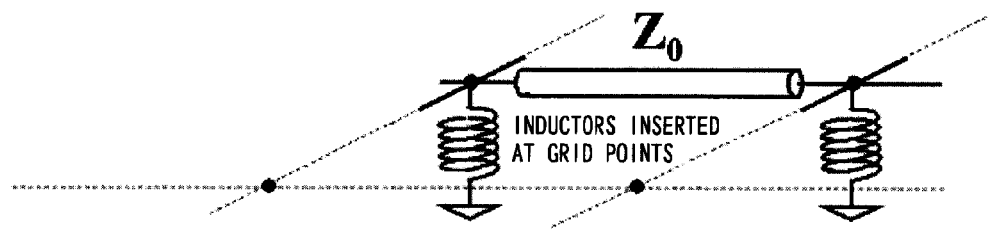
FIGS. 1A and 1B are diagrams useful in describing the principle of operation of the present invention.
Figure 1B:
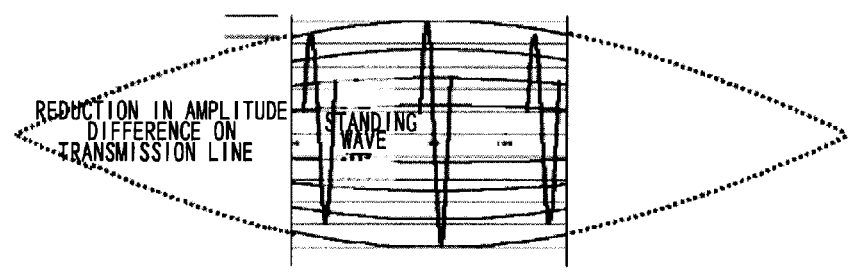
Figure 9A:
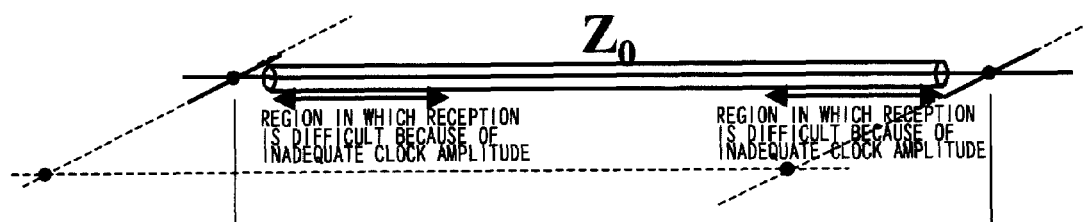
FIGS. 9A and 9B are diagrams useful in describing the problems of a grid-type clock distribution network according to the conventional art.
Figure 9B:
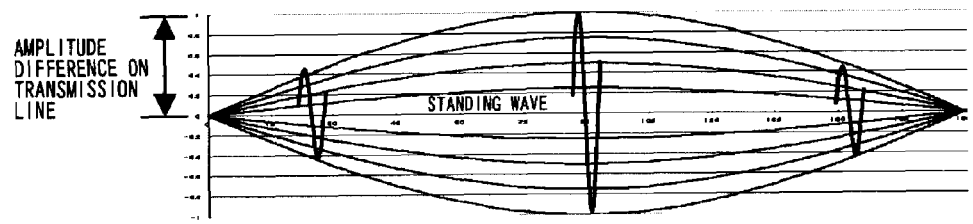

Examples of the present invention will now be described in detail with reference to the accompanying drawings. As illustrated in FIG. 1A, inductances are provided at the grid points of a clock distribution network (at both ends of a transmission line), thereby changing the phase of a standing wave in the clock distribution network, suppressing a difference in amplitude on the transmission line and assuring a degree of freedom in terms of the position at which the clock is received. More specifically, in accordance with the present invention, as illustrated in FIG. 1B, a difference in amplitude (a deviation in amplitude) of the standing wave on the transmission line is reduced in comparison with that on the transmission line in the conventional art of FIG. 9B, and supply of the signal to the supply destination can be performed from any location on the transmission line.

Figure 2A:
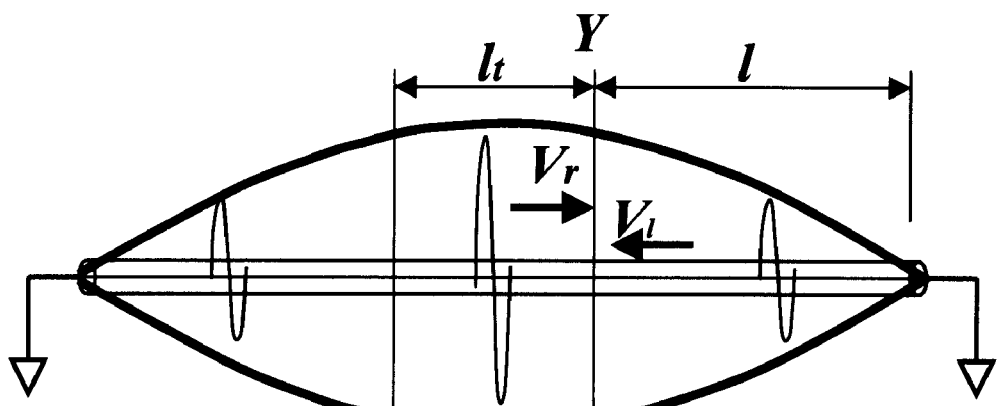
FIGS. 2A and 2B are diagrams useful in describing a conventional standing wave and a standing wave according to the present invention, respectively.

The operations and effects of inductance on a standing wave on a transmission line will be described next. FIG. 2A is a diagram useful in describing a conventional arrangement in which both ends of a long transmission line are terminated by being short-circuited. FIG. 2A illustrates a case where the length of the transmission line is a half wavelength and a half-wavelength standing wave is being produced. This arrangement has a standing-wave resonant mode and illustrates a first resonant standing wave.

Figure 2B:
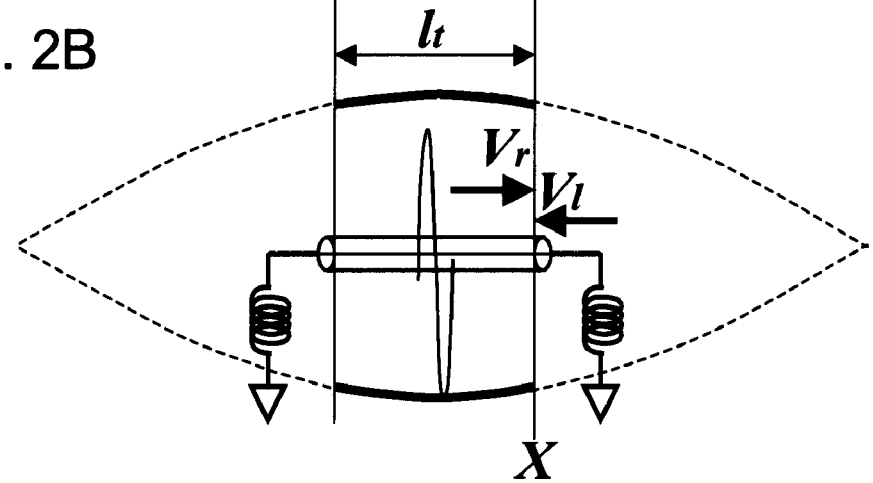

FIG. 2B illustrates an example in which inductive loads are connected to both ends of a transmission line in accordance with the present invention.

A standing wave is produced by superposition of incident and reflected waves. In FIG. 2A, let $V_r(Y)$ and $V_i(Y)$ respectively represent the voltages of the incident and reflected waves at a position "Y" on the transmission line. Since the wave is a standing wave, the relationship between phase $\theta_i(Y)$ of the reflected wave $V_i(Y)$ and phase $\theta_r(Y)$ of the incident wave $V_r(Y)$ is expressed by Equation (1) below.

$$\theta_i(Y) = \theta_r(Y) + 2\beta l + \angle \Gamma_{sh} \quad (1)$$

In Equation (1), $\angle \Gamma_{sh}$ represents the phase characteristic of a reflection coefficient $\Gamma_{sh}$ at the short-circuited terminals (see FIG. 2A). $\Gamma_{sh}$ and $\angle \Gamma_{sh}$ are given by the following equations:

$$\Gamma_{sh} = -1$$

$$\angle \Gamma sh = -\pi \quad (2)$$

Further, in Equation (1), $\beta$ is the phase constant of the transmission line, an l represents the distance from position "Y" to the end of the transmission line.

The relationship between phase $\theta_i(X)$ of the reflected wave at the end "X" of the transmission line of FIG. 2B and phase $\theta_r(X)$ of the incident wave is expressed by Equation (3) below.

$$\theta_i(X) = \theta_r(X) + \angle \Gamma_{ind} \quad (3)$$

In Equation (3), $\angle \Gamma_{ind}$ represents the phase characteristic of a reflection coefficient $\Gamma_{ind}$ at the inductive-load end, and the relationship between $\Gamma_{ind}$ and $\angle \Gamma_{ind}$ is expressed by the following equations:

$$\Gamma_{ind} = (j\omega L - Z_0)/(j\omega L + Z_0)$$

$$\angle \Gamma_{ind} = \pi - 2\tan^{-1}(\omega L/Z_0) \quad (4)$$

where $\omega$ represents resonance angular frequency, L the value of the inductive load and $Z_0$ the characteristic impedance of the transmission line.

In a case where the inductive load satisfies $$L = (Z_0/\omega)\tan(\pi - \beta 1) \quad (5)$$

the phase differences between the incidence waves and reflected waves at the positions "X" and "Y" in the transmission line of FIGS. 2A and 2B are identical and Equation (6) below holds.

$$\Gamma_{ind} = 2\beta l + \Gamma_{sh} \quad (6)$$

The standing wave in FIG. 2B at this time is a waveform from which a low-amplitude segment indicated by 1 of the standing wave in the conventional system (FIG. 2A) has been eliminated.

Moreover, the standing wave of FIG. 2B has a resonance frequency identical with that of the transmission line of FIG. 2A irrespective of the fact that the transmission line of FIG. 2B is shorter.

The inductors implement inductive loads and hasten the phase of the reflected wave. The fact that a low-amplitude segment is cut away from a standing wave of the conventional system by using a lumped inductive load constitutes one main characteristic of the technical idea of the present invention.

The standing wave of FIG. 2B is capable of oscillating at the same frequency on a transmission line much shorter than that shown in FIG. 2A (e.g., on a transmission line that is one-tenth or more shorter).

More specifically, with a transmission line having inductive loads at both its ends, a standing wave having a constant phase and a substantially constant amplitude can be supplied to the transmission line. A clock having a uniform phase and a substantially uniform amplitude can be supplied by a dense grid more that is possible with a clock supply system using the grid-based standing wave described in Non-Patent Document 4.

The resonance frequency of a standing wave is represented by Equation (7) below.

$$\omega = (Z_0/L)\tan[(\pi - \beta l_r)/2] \quad (7)$$

where $l_r$ is the length of the transmission line in FIG. 2B.

Equation (7) indicates that the resonance frequency is capable of being changed not only by the length of the transmission line but also by the value of the inductive load L.

Thus, in accordance with the present invention, signal wiring is not thought of as being a simple capacitance and is dealt with as a transmission line whose characteristic impedance has been stipulated, and phase delay due to delay along the transmission line and phase rotation ascribable to inductive load are combined to cut away large-amplitude locations from a standing wave. The principle of the present invention set forth above will now be described in accordance with examples applied to an actual signal interconnection architecture.

FIG. 3A is a diagram illustrating the basic configuration of a clock distribution network according to an example of the present invention. A clock distribution network of a 6×6 grid is illustrated for the sake of simplicity. It goes without saying that the present invention is not limited to the 6×6 grid configuration. FIG. 3B is an enlarged view of the configuration of a unit transmission line disposed between grid points in FIG. 3A.

As shown in FIGS. 3A and 3B, a clock distribution network 10 is a two-dimensional grid structure and has 36 (6×6) transmission-line cross points. Complementary (differential-type) signal wires $11_1$, and $11_2$ are arranged in six sets extending in parallel in the row direction and in six sets extending in parallel in the column direction and construct a grid-type distribution network. A pair of complementary (differential) signal wires is handled as a complementary (differential) transmission line. Two parallel signal wires (of impedance $Z_0$) $11_1$ and $11_2$ constituting the complementary signal wires are connected to each other via inductors $12_1$ and $12_2$ at respective cross points (grid points), as illustrated in FIG. 3B. Oscillators $13_1$ and $13_2$ are provided in parallel with the inductors L between the two parallel signal wires $11_1$ and $11_2$ constituting the complementary signal transmission line. The oscillator $13_1$ ($13_2$) includes a transistor pair (Q1, Q2) having their sources connected in common with a power supply and having their drains and gates cross-connected; and a transistor pair (Q3, Q4) having their sources connected in common with a power supply via a transistor Q5 and having their drains and gates cross-connected.

The oscillators $13_1$ and $13_2$ function as negative resistors that compensate for transmission-line loss. The inductors $12_1$ and $12_2$ form inductive loads and hasten the phase of the reflected wave.

As mentioned above, a low-amplitude segment is cut from the standing wave by using inductive loads of distribution-constant type.

In accordance with the clock distribution scheme of this example, a standing-wave clock having a uniform phase and a substantially uniform amplitude can be supplied over the full chip area.

In accordance with this example, by using a sufficient inductive load, grid pitch can be made much finer using than with the conventional standing-wave scheme.

Further, in accordance with the present invention, clock frequency can be designed irrespective of grid pitch.

Since the driver structure of the finer pitch does not necessitate shallow tree drive, latency, skew, jitter and power dissipation can be reduced according to this example.

Although there is no specific limitation, the clock distribution network 10 is mounted as a two-dimensional structure of metal wiring layers (metal interconnects). Differential clock signals (CLK, /CLK) are supplied from the grid-type clock distribution network 10 to clock synchronous circuits $20_1$ and $20_2$ in the lower layer or on the substrate.

A test chip of a 20-GHz clock distribution network was designed using 0.18 μm digital CMOS technology (the specifications are set forth below).

Example 1

6×6 grid size;
Area: 2.4 mm×2.4 mm;
Frequency: 20 GHz;
Process: 0.18 μm;
Power consumption: (6×6)×6 (mA)×1.8 V=0.389 W@20 GHz [19.4 mW/GHz]

Example 1 will be described in contrast to with comparison examples.

The specifications of the standing-wave scheme according to Non-Patent Document 4 are illustrated as Comparison Example 1.

Comparison Example 1

Cross-coupled oscillating circuits: 15
Area: 3 mm×1.5 mm;
Frequency: 10 GHz;
Process: 0.18 μm;
Power consumption: 0.43 W@10 GHz [43 mW/GHz]

If a comparison is made per identical area, it will be understood that Example 1 according to the present invention consumes half as much power as Comparison Example 1 per GHz.

With Comparison Example 1, however, there is a limitation with regard to locations where clock buffers can be inserted, and since the grid size is large, a number of buffer stages are required. As a result, Example 1 achieves a reduction in power dissipation.

Further, if a comparison is made taking into consideration the cross-coupled oscillating circuits of Comparison Example 1, the number of these oscillating circuits is 15, which is about half the number 36 of grid points. In Example 1, clock distribution can be carried out with one-fourth the power dissipation of Comparison Example 1 per GHz.

The H-tree scheme according to Non-Patent Document 5 is illustrated as Comparison Example 2.

Comparison Example 2

Area: 10 mm×10 mm;
Frequency: 6.9 GHz;
Process: 90 nm;
Power consumption: 11.2 W@6.9 GHz [(0.75+1.75)/2=) 1.625 W/GHz]

where the ratio of power dissipation of global buffers to local buffers is assumed to be 1:1.

In Example 1, grid spacing is 400 μm. Therefore, if the area of Comparison Example 2 is 10 mm×10 mm, then this is a 25×25 grid structure.

Accordingly, we have the following:

25×25×6 mA×1.8 V=6.75 W@20 GHz [0.338 W/GHz]

In accordance with this example, power dissipation that is 20% per GHz in comparison with Comparison Example 2 (namely a reduction on the order to 80%) is achieved. With Comparison Example 2, however, this is a comparison with a low frequency of 6.9 GHz. Since the 90 nm process is used, the power dissipation of Comparison Example 2 is high owing to the 20 GHz, 0.18 μm conversion of this example. Accordingly, it will be understood that a further reduction in power dissipation is achieved with the present invention.

An example of design of a test chip fabricated according to Example 1 of the present invention as well as a simulation will now be described. Transmission lines and inductors were designed according to 0.18 μm digital CMOS technology. The inductors were mounted as spiral inductors of fourth and fifth metal layers. Complementary (differential) transmission lines were fabricated with a coplanar structure in the sixth metal layer, and a power-source line (VDD) and ground (GND) line were placed in first and second metal layers underlying the transmission lines. The outer and inner diameters of the inductors were 70 μm and 50 μm, respectively, and the number of turns was 1.75. The length of the transmission line between inductors was 400 μm. MOSFETs for oscillators implementing cross-coupled conductors were placed in the vicinity of the inductors.

A circuit simulation of the above-mentioned 6×6 grid structure was performed. The inductors, differential transmission lines and VDD, GND lines were modeled as rational functions in order to perform a time-domain analysis. The parameters of the rational functions were approximated from an S-parameter calculated by an electromagnetic field solver. A difference in amplitude of a simulated 20-GHz oscillating wave between the middle of a differential transmission line and both ends was smaller than 32 mV, which was 2% of peak-to-peak amplitude. Furthermore, even in relation to simulated oscillating waves of all 36 grid points of the mentioned 6×6 grid, skew was smaller than 670 fs, which was 1.3% of the clock period in a case where the inductors exhibited a variation of ±10%. Power consumption was 10.8 mW/grid point at a power-source voltage of 1.8 V.

Clock oscillation at a frequency of 17.2 GHz based upon the above-described test chip fabricated according to 0.18 μm 6-metal CMOS technology was demonstrated. In order to measure the test chip, a G (ground)-S (signal)-G (ground) pad was placed at the middle of the transmission line and the signal pad was capacitively coupled to the transmission line at oscillation frequency with an attenuation of −17 dB. The attenuation characteristic of the capacitively coupled pad was measured. Further, a clock frequency of 17.2 GHz was realized on the transmission line at 400 μm from the measured frequency spectrum. The length of the transmission line was less than one-tenth the length of the transmission line of the standing-wave oscillator (SWO) in the conventional art (Non-Patent Document 3). Owing to the attenuation of −17 dB at the capacitance pad, differential peak-to-peak voltage was estimated at 0.28 Vp-p. Phase noise at a 1-MH offset was −108 dBc/Hz. Clock jitter was 110 fs (rms), which was less than 0.2% of the clock period. Power consumption was 13 mW at a power-source voltage of 1.8 V.

Figure 4B:
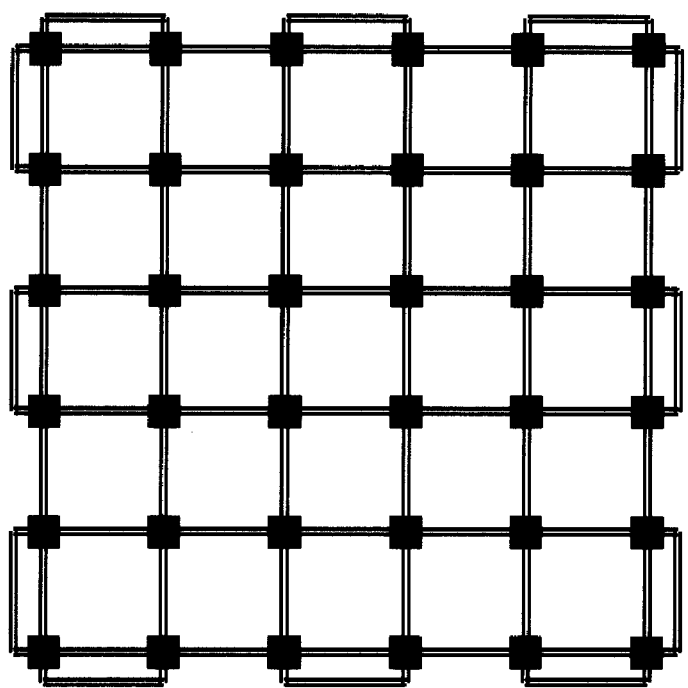
FIG. 4B is a diagram illustrating the configuration of a grid network according to an example of the present invention.
Figure 4A:
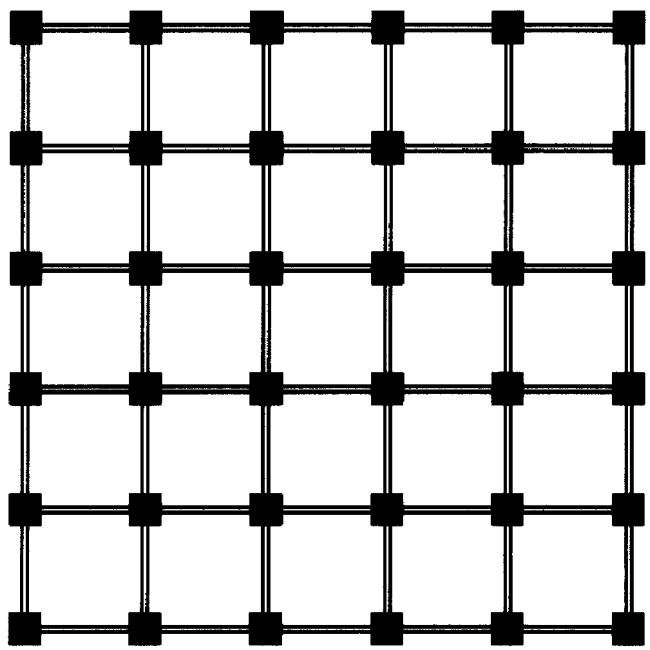
FIG. 4A is a diagram illustrating the configuration of an ordinary grid network.

Another example of the present invention will now be described. In this example, the number of lines connected to each of the grid points is made the same, as illustrated in FIG. 4B. In the case of the grid network of FIG. 4A, the numbers of lines connected to the grid points are two at the four corners of the square of the 6×6 grid, three at the four grid points on each side, and four at the 16 grid points in the interior. By contrast, as illustrated in FIG. 4B, lines are provided connecting the four corners of the square of the 6×6 grid and the adjacent points on the sides, the two intermediate grid points on each side are connected together by two lines, and the number of complementary transmission lines connected to each grid point is made four, whereby stable oscillation is performed under identical load conditions.

Figure 5:
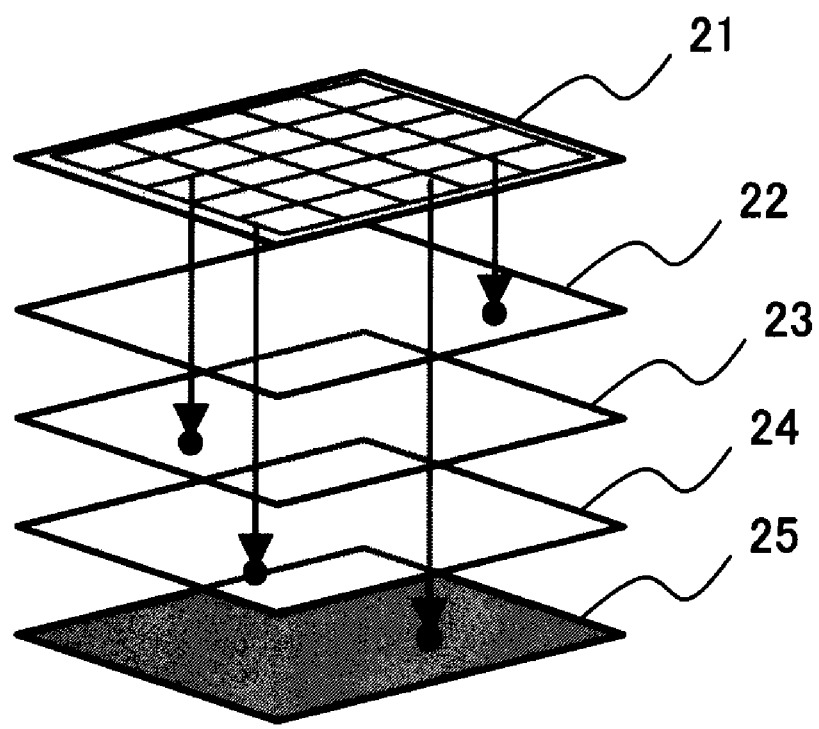
FIG. 5 is a diagram schematically illustrating the structure of a three-dimensional LSI chip according to the present invention.
Figure 6B:
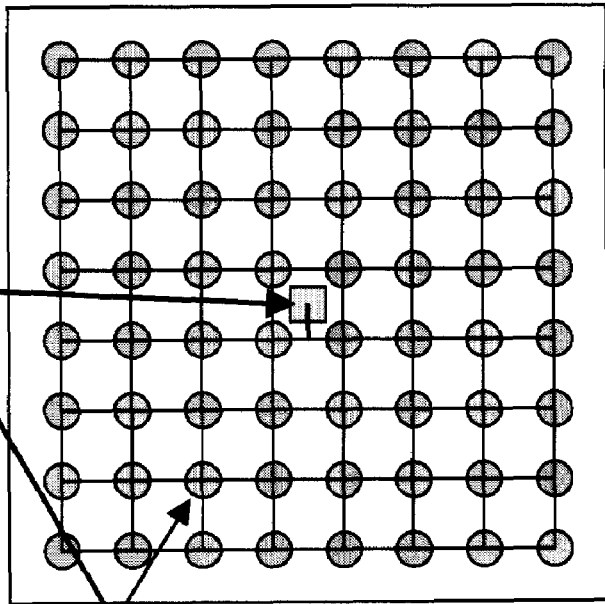
FIG. 6B is a diagram illustrating the configuration of a grid system according to the conventional art.
Figure 6A:
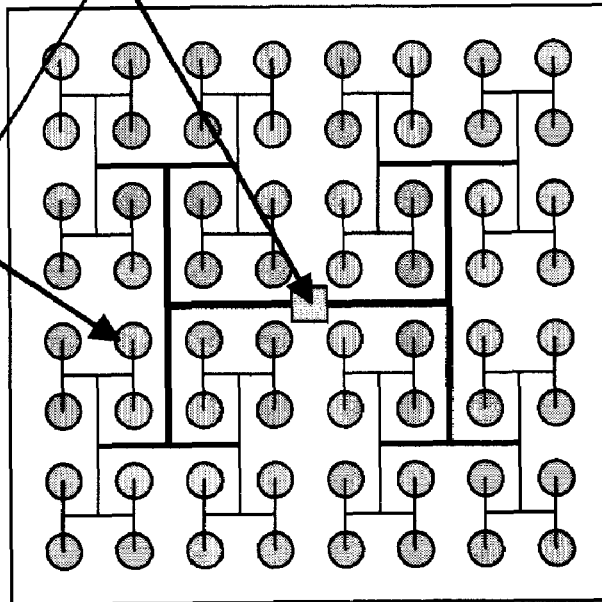
FIG. 6A is a diagram illustrating the configuration of an H-tree distribution system according to the conventional art.
Figure 7A:
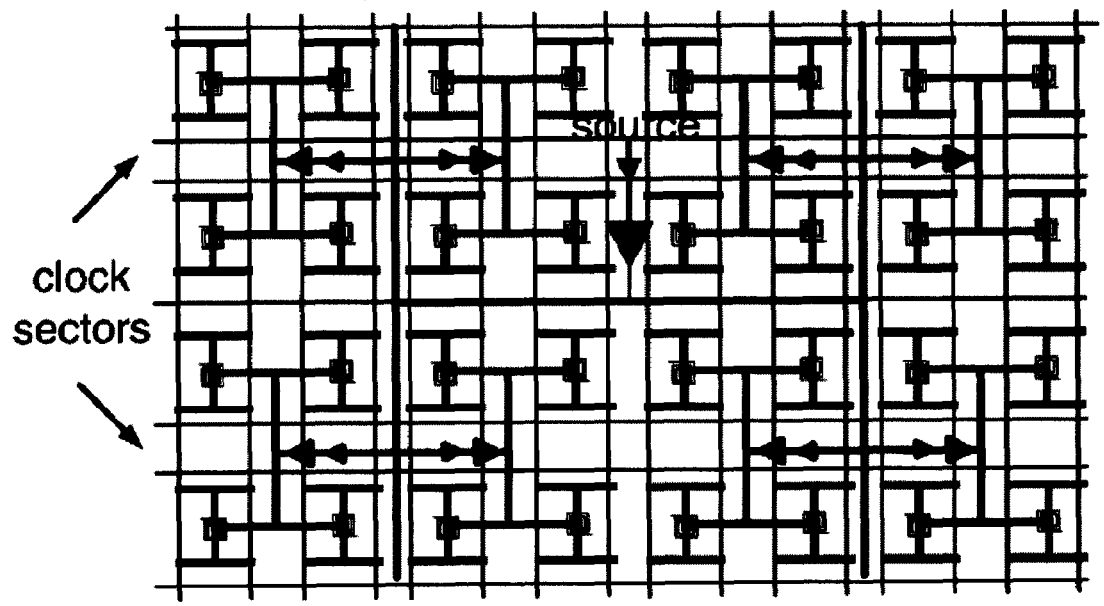
FIGS. 7A and 7B are diagrams illustrating an example of a clock distributions system according to the conventional art.
Figure 7B:
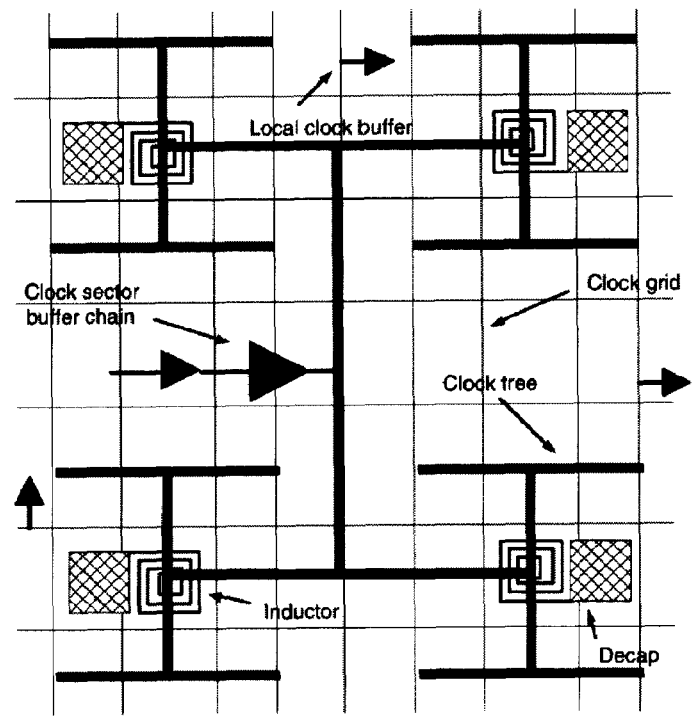
Figure 8A:
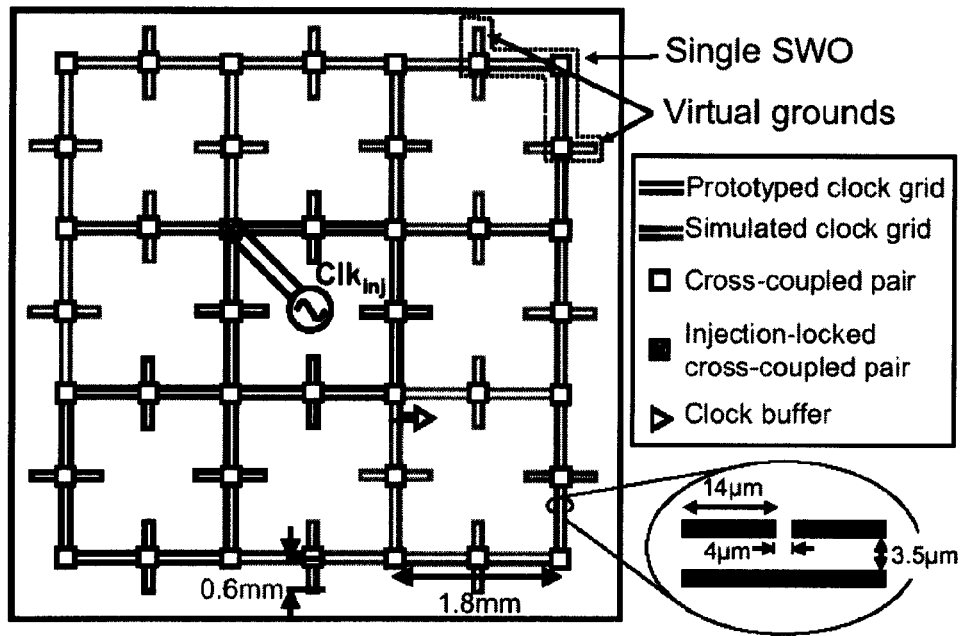
FIGS. 8A and 8B are diagrams illustrating an example of a clock distributions system according to the conventional art.
Figure 8B:
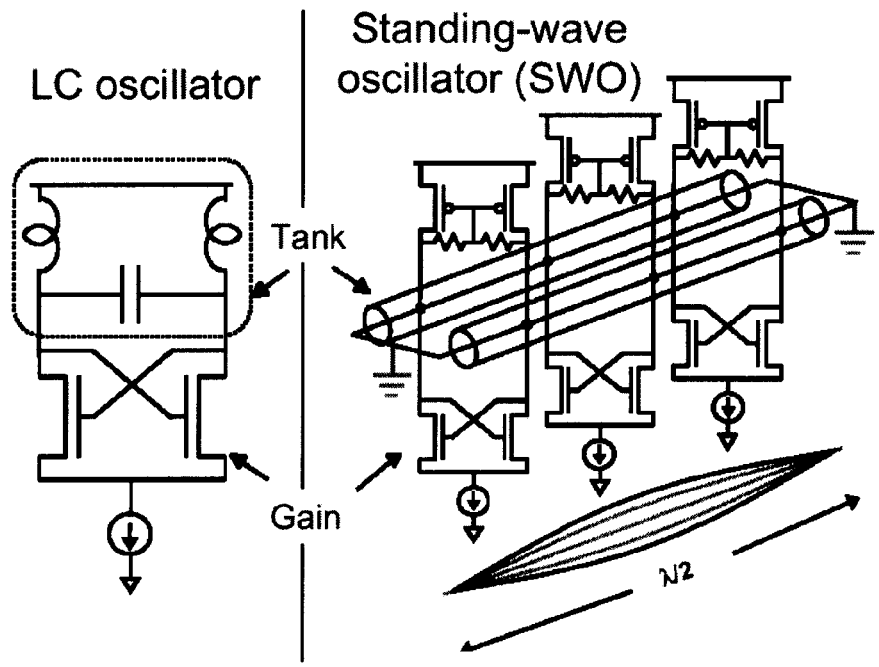

In accordance with the present invention, a uniform distribution layer 21 of an ultra-high-speed clock based upon a grid network is provided, as illustrated in FIG. 5, and an ultra-high-speed clock is distributed from the clock uniform distribution layer 21 to a plurality of other layers (layers that are the destination of the supplied clock) 22 to 25. That is, it is possible to distribute an ultra-high-speed clock from a clock driving layer of a specific layer to other layers in a three-dimensional LSI chip. It should be noted that it is permissible to adopt an arrangement in having an inductive load and a variable capacitive element as loads.

In accordance with a standing-wave clock distribution scheme having an inductive load, a low-amplitude segment is cut from the conventional standing wave by a phase shift arising from the inductive load. As indicated by the circuit simulation of the 6×6 grid structure, a 20-GHz clock distribution network was designed by 0.18 μm digital CMOS technology, and high-quality clock distribution was confirmed, namely a clock skew between all grid points that is small, i.e., 1.3% of the clock period, an amplitude deviation that is a small 32 mV, and power dissipation of 10.8 mW/grid point.

Another aspect of the present invention will now be described. In this aspect of the present invention, oscillating circuits placed at both ends of the standing-wave path include a mutual inductance as the inductance for phase compensation, and it will suffice if the standing-wave path is placed in such a manner that an end of the standing-wave path contacts another standing-wave path. That is, in a case where the invention is applied to a grid-type clock distribution network that transmits a clock signal differentially, oscillating circuits placed at respective ones of both ends of the differential transmission line include a mutual inductance (M) as the inductance for phase compensation. The differential transmission line forms a standing-wave path on which a standing wave is produced across the line, and it will suffice if the end portion of the standing wave contacts another standing-wave path. In the present invention, the mutual inductance is a mutual inductance between one inductor of the oscillating circuit and one inductor of the oscillating circuit of the neighboring differential transmission line. In the present invention, the oscillating circuits (14 in FIGS. 10A, 10B) at both ends of the differential transmission line include first and second transistors (Q1 and Q2 in FIG. 10B), the sources of the transistors being connected to ground, the drain of one transistor being cross-connected to the gate of the other transistor, each cross-connection point being connected to one ends of the differential transmission line; and first and second inductors ($12_1$, $12_2$ in FIG. 10B) connected between one ends of the differential transmission line and the power supply. In the present invention, grid pitch is set freely to any value less than the length of the line.

Figure 10A:
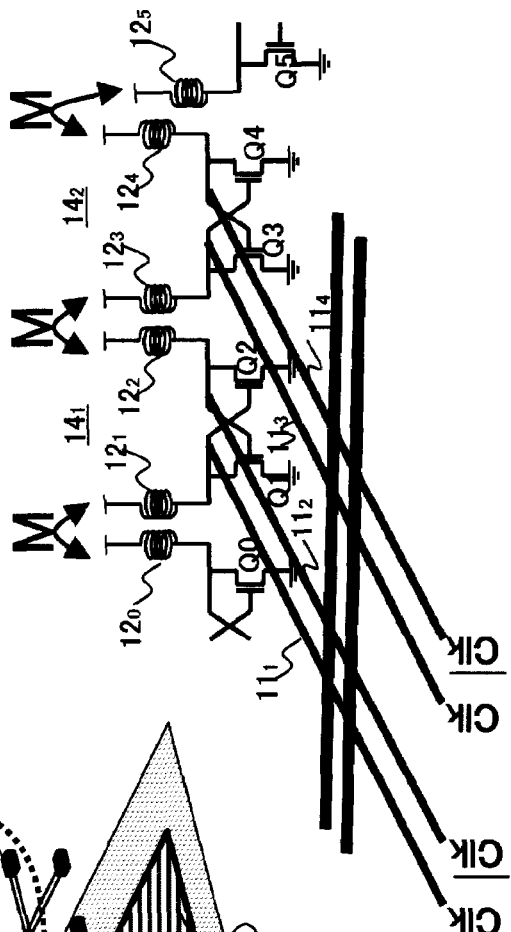
FIG. 10A is a diagram illustrating the configuration of a grid network according to another example of the present invention.
Figure 10B:
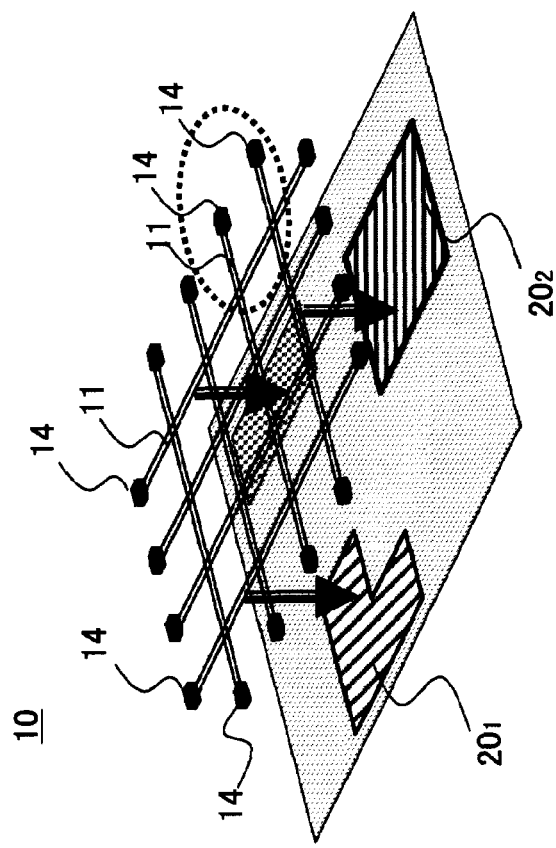
FIG. 10B is a diagram illustrating the configuration of an oscillating circuit at the end of a standing-wave path.

FIGS. 10A and 10B are diagrams illustrating the configuration of another aspect of the present invention. FIG. 10A illustrates a clock distribution network of a 4×4 grid for the sake of simplicity. In FIG. 10A, reference numerals $20_1$ and $20_2$ denote clock synchronizing circuits that receive supply of a clock. It should be noted that the present invention is not limited to the 4×4 grid configuration. FIG. 10B is an enlarged view of the configuration of an oscillating circuit (oscillator) 14 placed at both ends of the standing-wave path of FIG. 10A. In this example, the oscillating circuit 14 is provided at both ends of the grids (standing-wave path), as illustrated in FIG. 10A, complementary signals (clocks) are generated and eight sets of equal-length signal lines 11 (clock-signal transmission lines) are arranged in the form of a grid. This arrangement is such that oscillating circuits are not placed at the cross points of standing-wave paths, in contrast with the arrangement shown in FIGS. 3A and 3B.

As illustrated in FIG. 10B, the oscillating circuit (oscillator) 14 placed at both ends of each standing-wave path employs a mutual inductance (M), which is formed between this line and another line at each end, as the inductance for phase compensation. More specifically, as shown in FIG. 10B, an end of one signal wire $11_1$ of differential clock transmission line is connected to a common connection point between the drain of source-grounded transistor Q1 and the gate of source-grounded transistor Q2 and to one end of inductor $12_1$. An end of the other signal wire $11_2$ is connected to a common connection point between the drain of transistor Q2 and the gate of transistor Q1 and to one end of inductor $12_2$. The inductors $12_1$ and $12_2$ and transistors Q1, Q2 construct oscillating circuit $14_1$ provided at one end of signal wires $11_1$ and $11_2$. An end of one signal wire $11_3$ of other differential clock transmission line is connected to a common connection point between the drain of source-grounded transistor Q3 and the gate of source-grounded transistor Q4 and to one end of inductor $12_3$. An end of the other signal wire $11_4$ is connected to a common connection point between the drain of transistor Q3 and the gate of transistor Q4 and to one end of inductor $12_4$. The inductors $12_3$ and $12_4$ and transistors Q3, Q4 construct oscillating circuit $14_2$ provided at one end of signal wires $11_3$ and $11_4$. Let M represent the mutual inductance of inductors $12_0$ and $12_1$, the mutual inductance of inductors $12_2$ and $12_3$ and the mutual inductance of inductors $12_4$ and $12_5$ in each of the oscillating circuits placed at both ends of the standing-wave paths. In this example, degree of freedom in placement of the lines and the density of the lines are raised in comparison with a case where self-inductances are placed at the grid cross points.

The actions and effects of this example will be described with reference to FIGS. 11A and 11B. FIG. 11A illustrates an example in which standing-wave paths of line length TL (grid pitch=TL) using self-inductance are arranged in the form of a 4×4 grid. In this case, area occupied is $(3TL)^2$.

By contrast, as shown in FIG. 11B, which illustrates a 4×4 grid-shaped layout (grid pitch<line length TL) in a case where mutual inductance is used, area occupied is about $TL^2$. Accordingly, area can be reduced greatly with respect to the same number of grid points. Alternatively, it is possible to reduce grid pitch.

In accordance with this example, a much reduced grid pitch can be formed by using mutual inductance (M) with regard to a standing-wave line length required by the clock frequency.

Figure 12A:
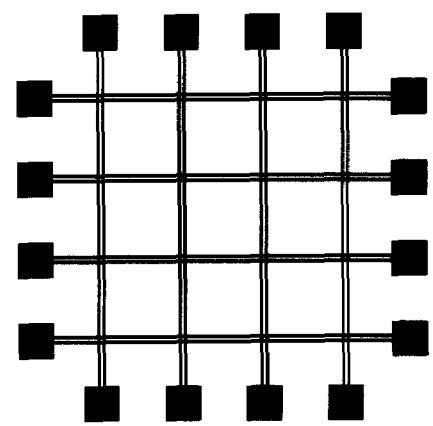
FIGS. 12A, 12B and 12C are diagrams illustrating layout examples according to the example of FIGS. 10A and 10B.
Figure 12B:
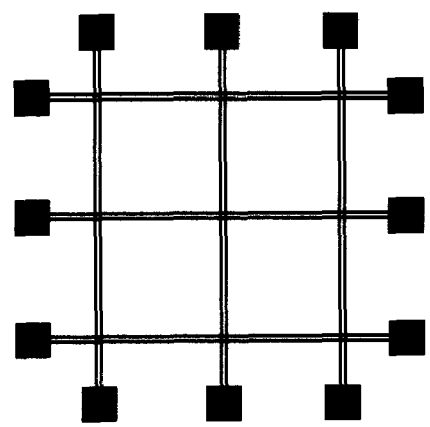
Figure 12C:
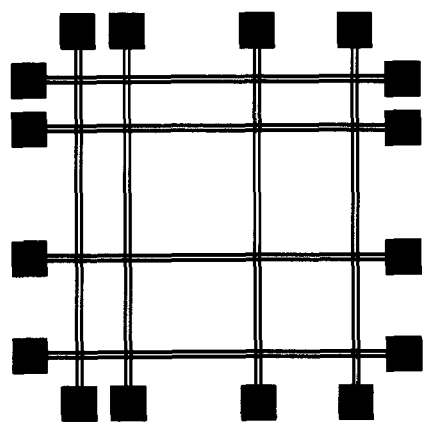

In accordance with this example, it is possible to form a high-density clock supply network and it is also possible to change the pitch (see FIGS. 12A to 12C). FIGS. 12A and 12B are related in that grid pitch is uniform but small in FIG. 12A and large in FIG. 12B. Further, in this example, grid pitch may be made non-uniform (unequal), as illustrated in FIG. 12C.

FIGS. 13A and 13B are diagrams illustrating a comparison between the configuration of the oscillating circuit of the above-described example and the configuration of the oscillating circuit of this example. FIG. 13A is a diagram illustrating the oscillating circuit of the example shown in FIGS. 3A and 3B. FIG. 13B is a diagram illustrating the circuit configuration of the oscillating circuit according to this example depicted in FIGS. 10A and 10B. In accordance with this example, as illustrated in FIG. 13B, mutual inductance is treated as a load circuit, whereby an oscillating circuit can be changed from the CMOS circuit (see FIG. 3B) of FIG. 13A to a voltage doubler oscillating circuit based upon an n-MOS circuit. The arrangement of FIG. 13B has two transistors. In comparison with the arrangement of FIG. 13A (which has five transistors Q1, Q2, Q3, Q4 and Q5), the number of transistors is reduced to ⅖ and the power-source voltage is halved. Thus it will be understood that the number of elements is reduced as well as the power-source voltage.

Extraction of a clock from each standing-wave path in this example will be described next. FIGS. 14A and 14B are diagrams useful in describing methods of extracting a clock signal from a standing-wave path. The example shown in FIG. 14A is such that buffer circuits 15 are connected to the differential clock transmission line ($11_1$, $11_2$) so as to be equivalent loads in order to balance the loads of the standing-wave path between mutual signals. The buffer circuits 15 are provided at the middle of the differential clock transmission line ($11_1$, $11_2$) having oscillating circuits at both ends.

In FIG. 14B, a plurality of clock-extracting buffer circuits 15 are distributed uniformly along a line in such a manner that the position of the clock-supply destination can be set at will.

A verification prototype was produced using the example illustrated in FIGS. 10 to 14, and oscillation at 12 GHz was confirmed in a 5×5 grid layout. It was confirmed that phase noise was −103 dBc/Hz (at the time of a 1-MHz offset) and that RMS clock jitter was 0.86 ps. These are excellent characteristics.

In comparison with the foregoing example, this example has the effect of greatly reducing occupied area and power dissipation. Specifically, in terms of area efficiency, the occupied area was one-half to one-fourth in a case where number of grid points was compared, and in terms of power dissipation, the power dissipation was one-half to one-fourth when a comparison was made with the same oscillation frequency and same number of grid points.

Though the present invention has been described in accordance with the foregoing examples, the invention is not limited to this example and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A grid-type signal distribution network comprising:
a plurality of differential signal transmission lines interconnected in the form of a grid; and
a plurality of phase compensating circuits, each provided between an associated differential signal transmission line at a grid point of the differential signal transmission line;
wherein the number of the differential signal transmission lines commonly connected to the grid point is made the same for entire grid points.

2. The network according to claim 1, further comprising a plurality of oscillating circuits, each provided at the grid point of said differential signal transmission line.

3. The network according to claim 1, wherein said phase compensating circuit includes an inductance.

4. The network according to claim 1, wherein said phase compensating circuit includes an inductance and a variable capacitance.

5. The network according to claim 1, wherein a signal is supplied to a signal-supply destination circuit from any position on said differential signal transmission line.

6. The network according to claim 2, having a three-dimensional signal interconnection structure in which grid interconnection and oscillating circuits are formed in a layer separate from that of a group of signal-supply destination circuits.

7. The network according to claim 1, wherein distances between grid points are identical.

8. The network according to claim 3, wherein a standing wave having a constant phase and a substantially uniform amplitude is generated over the differential signal transmission line.

9. The network according to claim 8, wherein resonance frequency of the standing wave is decided by the length of the differential signal transmission line and inductance;
a low-amplitude segment of the standing wave is eliminated; and
with a differential signal transmission line shorter than that in a case where both ends of a differential signal transmission line are terminated by being short-circuited, oscillation is possible at a resonance frequency identical with that in a case where both ends of the differential signal transmission line are terminated by being short-circuited.

10. The network according to claim 9, wherein a signal transmitted through said signal distribution network takes on a frequency that does not depend upon grid pitch.

11. A semiconductor device having a signal distribution network set forth in claim 1.

12. A grid-type signal distribution network comprising:
a plurality of standing-wave paths, each including a line on which a standing wave is generated; and
oscillating circuits provided at respective ones of both ends of said standing-wave path, each of said oscillating circuits including a mutual inductance as inductance for a phase compensation;
wherein the standing-wave path is placed such that an end portion thereof is made in contact with another standing-wave path.

13. The network according to claim 12, wherein said mutual inductance is a mutual inductance between an inductor of said oscillating circuit of the standing-wave path and an inductor of an oscillating circuit of a neighboring standing-wave path.

14. A grid-type clock distribution network comprising:
a plurality of differential transmission lines, each transmitting a clock signal differentially; and
oscillating circuits provided at respective ones of both ends of said differential transmission line, each of said oscillating circuits including a mutual inductance as inductance for phase compensation;
the differential transmission line constructing a standing-wave path, on which a standing wave is generated over the line, and an end portion of which is made in contact with another standing-wave path.

15. The network according to claim 14, wherein said mutual inductance is a mutual inductance between one inductor of said oscillating circuit of the differential transmission line and one inductor of an oscillating circuit of a neighboring differential transmission line.

16. The network according to claim 14, wherein said oscillating circuit includes:
first and second source-grounded transistors having respective drains and respective gates cross-connected, each cross-connection point being connected to one ends of the differential transmission line; and
first and second inductors connected between one ends of the differential transmission line and a power supply.

17. The network according to claim 14, wherein grid pitch is set freely to any value less than line length of the differential transmission line.

18. The network according to claim 14, further including a plurality of clock-extracting buffer circuits connected to the differential transmission lines so as to become equivalent loads in order to balance the loads of the differential transmission line.

19. The network according to claim 14, wherein a plurality of clock-extracting buffer circuits are distributed uniformly along the differential transmission line in such a manner that the position of a clock-supply destination can be set at will.

20. A semiconductor device in which global clock distribution to clock synchronous elements in a chip is performed using a clock distribution network set forth in any claim 14.

* * * * *

UNITED STATES PATENT AND TRADEMARK OFFICE
CERTIFICATE OF CORRECTION

| | |
|---|---|
| PATENT NO. | : 7,538,603 B2 |
| APPLICATION NO. | : 11/744694 |
| DATED | : May 26, 2009 |
| INVENTOR(S) | : Hiroaki Ikeda et al. |

It is certified that error appears in the above-identified patent and that said Letters Patent is hereby corrected as shown below:

Column 14, line 54, delete "in any claim 14" and insert --in claim 14--

Signed and Sealed this

Fifteenth Day of September, 2009

David J. Kappos
*Director of the United States Patent and Trademark Office*